United States Patent
Weyers

(10) Patent No.: US 6,608,480 B1
(45) Date of Patent: Aug. 19, 2003

(54) RF COIL FOR HOMOGENEOUS QUADRATURE TRANSMIT AND MULTIPLE CHANNEL RECEIVE

(75) Inventor: Daniel J. Weyers, Wauwatosa, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/260,603

(22) Filed: Sep. 30, 2002

(51) Int. Cl.$^7$ ................................................. G01V 3/00
(52) U.S. Cl. .................................... 324/318; 324/322
(58) Field of Search ................................. 324/318, 320, 324/322, 300, 306, 307, 309, 314; 600/421, 422

(56) References Cited

U.S. PATENT DOCUMENTS

| | | | | |
|---|---|---|---|---|
| 5,143,688 A | * | 9/1992 | Mansfield | 324/318 |
| 6,223,065 B1 | * | 4/2001 | Misic et al. | 600/410 |
| 6,411,090 B1 | * | 6/2002 | Boskamp | 324/318 |

OTHER PUBLICATIONS

Hayes, Edelestein, Schenck, Mueller, & Eash, "An Efficient, Highly Homogeneous RF Coil for Whole Body MRI at 1.5T," Journal of Magnetic Resonance 63, 1985, p 622.

Roemer, Edelstein, Hayes, Souza & Mueller, "The NMR Phased Array," Magnetic Resonance in Medicine 16, 1990, p 192.

* cited by examiner

*Primary Examiner*—Louis Arana
(74) *Attorney, Agent, or Firm*—Joseph S. Heino; Carl B. Horton

(57) ABSTRACT

The present invention provides for a body coil modeled after a birdcage coil and based on a ladder network design. A fixed number of single loop coils (N) are equally spaced around a cylinder. These coils must be driven 360°/N out of phase with respect to each other azimuthally. Each phase must increase 360°/N as azimuthally in order for single loop coil currents to mimic currents commonly seen in the quadrature birdcage coil. A switching circuit is necessary to change the transmit coil configuration and the N channel for phased array reception. This type of coil eliminates the otherwise necessary need to decouple the transmit coil from the receiver coils, but preserves the SNR benefit of having multiple receiver coils. This type of coil will improve SNR over ordinary volume coils and may be necessary imaging large patients where space around the patient is at a minimum.

26 Claims, 5 Drawing Sheets

T/R Switch

RF COIL FOR HOMOGENEOUS QUADRATURE TRANSMIT AND MULTIPLE CHANNEL RECEIVE

BACKGROUND OF THE INVENTION

This invention relates to magnetic resonance (MR) imaging systems. More particularly, it relates to a radio frequency (RF) coil for use within an MR imaging system for homogeneous quadrature transmit and multiple channel receive by the RF coil.

A magnetic resonance (MR) imaging system provides an image of a patient or other object in an imaging volume base on detected radio frequency (RF) signals from precessing nuclear magnetic moments. A main magnet produces a static magnetic field, or $B_0$ field, over the imaging volume. Similarly, gradient coils within the MR imaging system are employed to quickly switch into effect magnetic gradients along mutually orthogonal x, y, z coordinates in the static $B_0$ field during selected portions of an MR imaging data acquisition cycle. Meanwhile, an RF coil produces RF magnetic field pulses, referred to as a $B_1$ field, perpendicular to the $B_0$ field, within the imaging volume to excite the nuclei. The nuclei are thereby excited to precess about an axis at a resonant RF frequency. As the precession occurs into the transverse plane, the transverse component of magnetization is magnetically coupled to some external circuitry, typically a receiver. These transmitter and receiver coupling mechanisms both are called RF coils.

RF antennas or coils are tuned and resonate in a frequency band defined by the Larmor frequency and the presence of a gradient field. The filling factor for RF coils is defined as the volume of sensitivity for a given RF coil. In general, the RF coil should be completely filled by the subject, as to eliminate unwanted noise sensitivity from the larger volume. This filling factor is very important. A transmitter coil or body coil, is designed to be uniformly sensitive over an entire field of view (FOV) as defined by the system. This design provides flexibility for imaging large or small volumes. However, the filling factor for such a coil is very large and, therefore, the potential signal to noise ratio (SNR) for a given scan is limited.

A design requirement for the RF transmitter coil is that it be extremely uniform over the entire imaging volume. This is necessary in order to generate a constant flip angle, tipping the $B_1$ magnetization equally over the entire volume. The theory of reciprocity tells us that the $B_1$ sensitivity for a transmit coil will be equal to its $B_1$ receive sensitivity. Tradeoffs must be made between uniform $B_1$ sensitivity and higher SNR. These tradeoffs are clearly seen when comparing the RF body coil to phased array received-only surface coils.

It is also desirable to have a coil permitting quadrature excitation and detection, or the ability to generate and receive circularly polarized fields. The most effective way to couple energy to or from the nuclei is by using fields that oscillate at the Larmor frequency. If these fields rotate in the same orientation as the magnetization, it maximizes energy coupling between the nuclei and the RF coils. A linearly polarized $B_1$ can be decomposed into two counter-rotating or circularly polarized components where one half of the power rotates clockwise and the other one half of the power rotates counter-clockwise. Both have a magnitude of ½ $B_1$. Only one of these components rotates in the same direction as the magnetization and, therefore, half of the power is wasted in a linear polarized field. By using quadrature excitation and detection, power is regained and signal increases by a factor of 2. A quadrature coil needs to split power equally into two channels, one delayed by 90° with respect to the other. These two channels are then connected to the two inputs of the RF coil to produce two fields that are perpendicular to each other.

RF coil tradeoffs between signal uniformity and high SNR have led to separate designs of coils, one for transmitting and one for receiving the $B_1$ magnetization. A surface coil is particularly useful to obtain images from tissues close to the surface of the patient. Surface coils provide higher SNR than whole-body coils because of smaller sensitive regions, leading to a decrease in noise coupled from the sample. The FOV of these coils is generally much smaller than volume coils. Therein lies the tradeoff. Phased array coils solve this problem by using multiple receiver channels to provide a larger region of sensitivity. Each of these coils is connected directly to an independent preamplifier and receiver chain. The magnitudes of these receivers are generally combined to form an image with extremely high SNR. The elimination of mutual inductance between independent coils must be achieved in order to provide uncorrelated noise and signal volumes for independent receiver coils.

In order to transmit and receive RF signals that optimize design tradeoffs between a volume transmit coil, with a high level of homogeneity, and small surface coils, able to achieve the highest SNR, separation of the RF transmit coil and the RF receiver coils is common practice. Historically, the invention of the birdcage RF volume coil has become a standard for homogenous transmit. The RF body coil is generally as large as 60 cm. in diameter and 50 to 70 cm. in length. System circuitry switches between the RF body coil and the various receiver coils. These receiver coils are arranged about the geometry of interest by using as many as 2 to 32 independent coils. The maximum number of receivers, within the data acquisition system, determines the maximum number of coil elements that the system is able to receive at any given time.

RF surface coils usually have inhomogeneous transmit fields. Their signal intensity decays as the distance from the center of the coil increases. When transmitting and receiving using surface coils, the field decays faster due to the addition of poor signal sensitivity from a surface coil during transmit and receive. There is a strong need to optimize and maximize the SNR from surface coils while maintaining the high homogenous transmit fields. A unique solution for achieving volume transmit field and optimizing independent receiver coils to improved SNR is, accordingly, an object of the present invention.

When scanning large patients, there is not always additional space to place surface coils around the anatomy. In these cases, a single volume coil must be used for both transmitting and receiving. A single transmit/receive surface array is desirable to transmit a uniform RF field, and receive as a phased array. This would improve SNR for large volume application. This would also decrease noise volumes during the independent coil reception, improve sensitivity near the coils, and increase the overall SNR, further objects of the present invention.

BRIEF SUMMARY OF THE INVENTION

According to the present invention, a body coil is modeled after a birdcage coil and based on a ladder network design. A fixed number of single loop coils (N) are equally spaced around a cylinder. These coils must be driven 360°/N out of phase with respect to each other azimuthally. Each phase must increase 360°/N as azimuthally in order for single loop coil currents to mimic currents commonly seen in the quadrature birdcage coil. A switching circuit is necessary to change the transmit coil configuration and the N channel for phased array reception. This type of coil eliminates the otherwise necessary need to decouple the transmit coil from the receiver coils, but preserves the SNR benefit of having multiple receiver coils. This type of coil will improve SNR over ordinary volume coils and may be necessary imaging large patients where space around the patient is at a minimum.

DETAILED DESCRIPTION OF THE INVENTION

Figure 1:
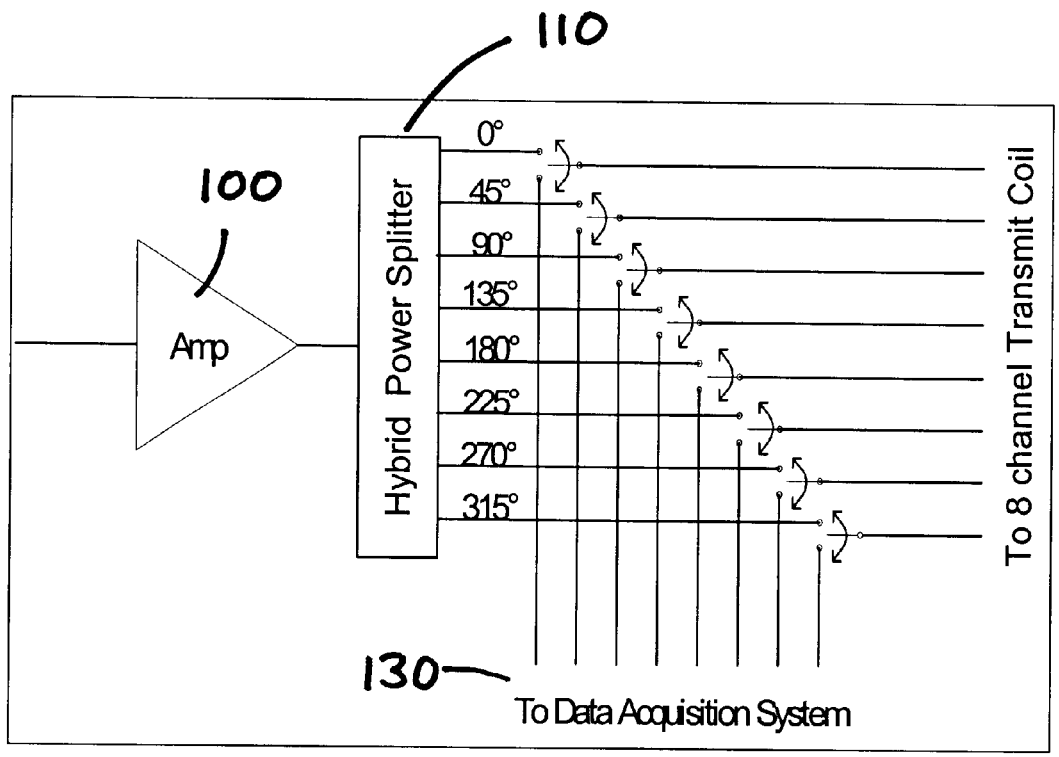
FIG. 1 is a diagrammatic view of a conceptual power splitter as employed with the coil of the present invention.
Figure 2:
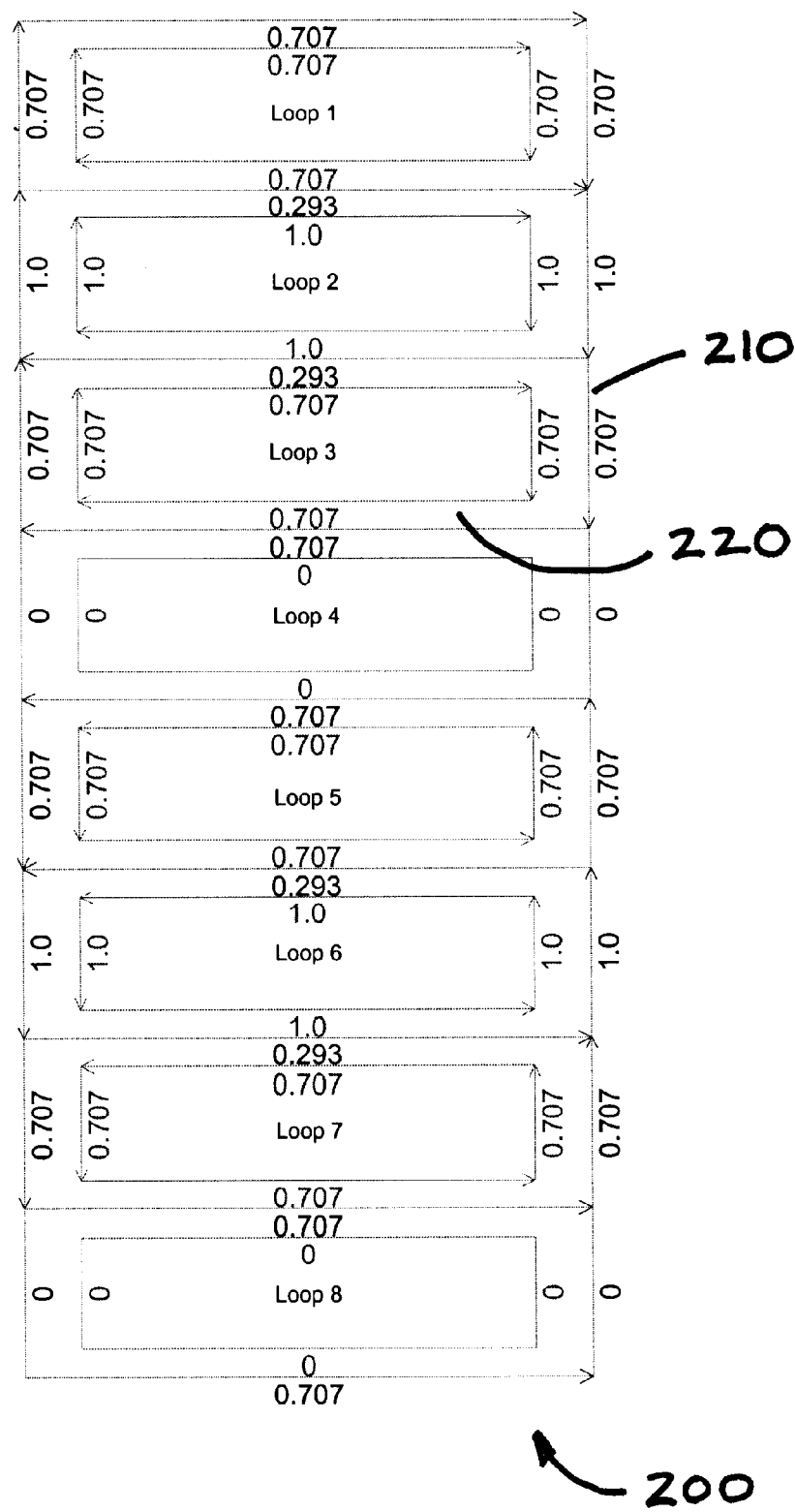
FIG. 2 is a diagrammatic view of the normalized currents in the coil of the present invention.
Figure 5:
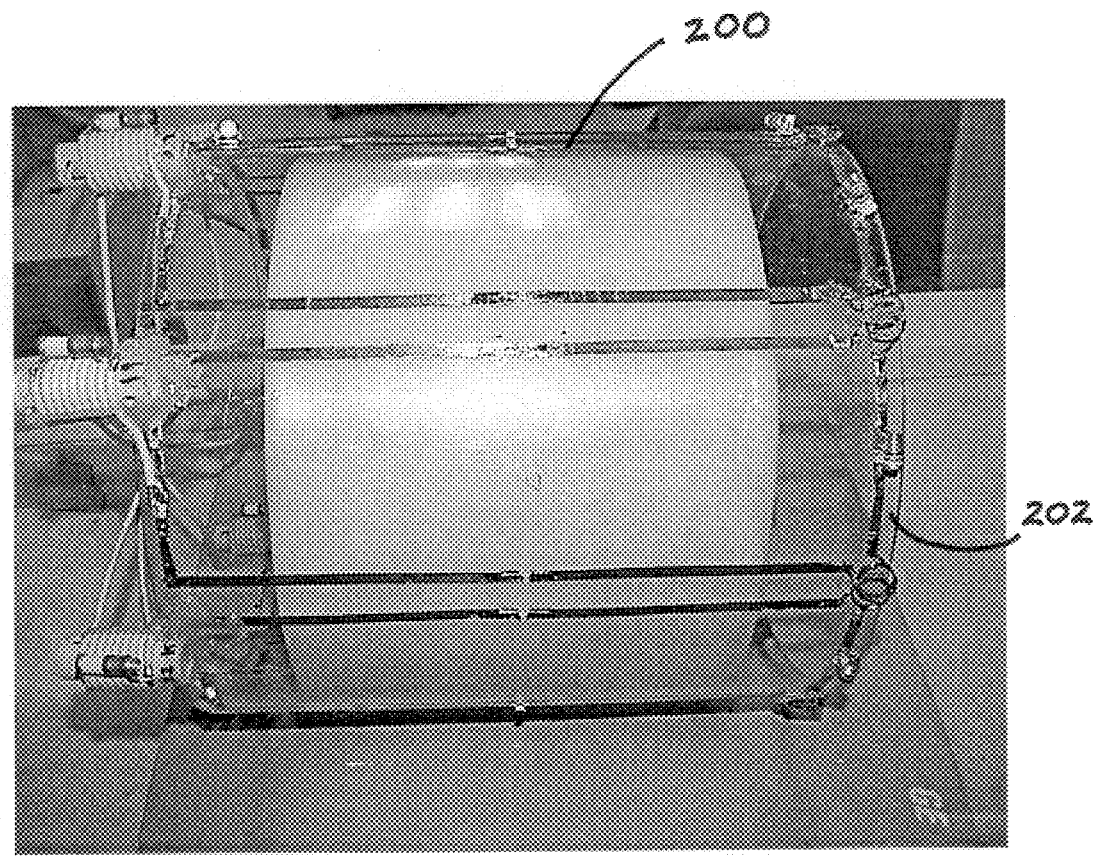
FIG. 5 is a photograph showing a front elevational view of a coil constructed in accordance with the present invention.

Referring now to the drawings in detail, wherein like numbered items represent like elements throughout, the birdcage coil of the present invention, generally identified 200, can be thought of as a ladder network wrapped around a cylindrical form 202 with its ends connected together. FIG. 5 is a photograph of a coil constructed in accordance with the present invention. FIG. 2 provides a high level view of the birdcage coil 200 as it is used in the present invention. As shown, eight loops are shown, although the number of loops is not a limitation of the present invention. The eight independent resonant loops are placed around an equal diameter cylinder and spaced apart from one another. The phase relationship between loops, circumferentially, is equal to 360°/N, where N is the number of coil loops. Using eight loops, or coil elements, requires that a power splitter be used where each power splitter output must have a 45° difference with respect to its nearest neighbor. The model of the power splitter 110 is shown in FIG. 1. The power splitter 110 circuitry includes a low impedance preamplifier 100.

Since a birdcage 200 is a ladder network with both ends connected together, certain conditions must exist. One is that the current in one element must equal that in the next. Therefore, a sinusoidal wave must be continuous. This sets up an environment where only certain resonant frequencies of a sinusoidal wave may exist. In the birdcage coil 200, this resonant frequency is a function of both the chip capacitors placed in series 210, and the length or parallel (shunt) 220 elements of the birdcage 200. The resonant modes in this type of coil are $\sin(n\Theta)$, where $n=1$ represents the homogeneous mode. This fundamental resonant mode $\sin(\Theta)$ must be tuned to the Larmor frequency to be effective in MR imaging. This fundamental resonance, where one wavelength equals the circumference of the birdcage coil 200, provides a homogeneous field throughout the inner volume of the coil 200. Other resonant modes have different RF field patterns, none of which are homogeneous throughout the volume and therefore are not necessarily useful for MR applications.

A quadrature driven birdcage coil uses two RF inputs, one of which is delayed by 90° (or a ¼ wavelength) from the other. Both inputs are connected to the coil 200 geometrically and electrically orthogonal to one another. This produces a circularly polarized RF field. This is also realized and practiced by using the quadrature power splitter 110 illustrated in FIG. 1.

As alluded to earlier, the birdcage coil 200 consists of N rungs (numbered 1 through N) and N semi-circular arcs, or end rings, at either end. In the experience of this inventor, coils with low efficiency require large currents to achieve a desired $B_1$ field. In a body transmit coil, the largest birdcage coil 200, there is an RF shield very close to the currents, within 2 cm. This shields the $B_1$ and currents in the birdcage conductors, thereby drastically reducing the efficiency of the birdcage coil 200. In order to achieve a desirable $B_1$ field using this type of coil, peak RF currents of 60 to 80 amperes are typical.

Conceptually, and as discussed earlier, using eight independent resonant loops to duplicate the transmit field of the birdcage 200 is achieved by using an eight-way, −9 dB power splitter 110 and adjusting the phase on each channel, during transmit, to ideally match the arc and rung currents seen in the birdcage coil 200. The eight independent resonant loops are placed around an equal diameter cylinder and are equally spaced. The phase delay in each loop cirumferentially is equal to 360°/N, where N is the number of coil elements used. When using eight elements, for example, each power splitter 110 output must have a 45° delta with respect to its nearest neighbors. The model of this power splitter 110 is illustrated in FIG. 1, switching each independent channel to be received into eight receivers as a phased array coil 130.

The currents shown below in Table 1 are representative of the eight-rung birdcage coil 200. When an equal power splitter 110 is used to drive eight independent coils with the above phase relationships, the amplitude of each loop can be calculated as shown.

TABLE 1

Arc Loop Currents and Birdcage Currents

| | Birdcage Currents | Loop Currents | |
|---|---|---|---|
| n | Arc | Phase | Cos |
| 1 | 1.000 | 0 | 1.000 |
| 2 | 0.707 | 45 | 0.707 |
| 3 | 0.000 | 90 | 0.000 |
| 4 | −0.707 | 135 | −0.707 |
| 5 | −1.000 | 180 | −1.000 |
| 6 | −0.707 | 225 | −0.707 |
| 7 | 0.000 | 270 | 0.000 |
| 8 | 0.707 | 315 | 0.707 |

It is then conceivable that the loop currents are forces to match the useful mode of the birdcage coil 200. The loop currents match the arc currents in the birdcage 200 one-to-one, but with two unequal rung currents in close proximity to one another, an effective rung current must be calculated and compared to that in the birdcage rungs. The following Table 2 shows the looped currents compared to that of the birdcage 200.

TABLE 2

8 Channel Rung Currents

| | Birdcage Currents | Loop Currents | | |
|---|---|---|---|---|
| n | Rung | Phase | Cos | Eff Rung |
| 1 | −0.293 | 0 | 1.000 | −0.293 |
| 2 | −0.707 | 45 | 0.707 | −0.707 |
| 3 | −0.707 | 90 | 0.000 | −0.707 |
| 4 | −0.293 | 135 | −0.707 | −0.293 |
| 5 | 0.293 | 180 | −1.000 | 0.293 |
| 6 | 0.707 | 225 | −0.707 | 0.707 |
| 7 | 0.707 | 270 | 0.000 | 0.707 |
| 8 | 0.293 | 315 | 0.707 | 0.293 |

These currents are shown geometrically in FIG. 2. As shown, one current path represents the individual loops as they are driven by the eight-way power splitter and the other current path represents effective currents. It should be mentioned that the phase relationships between each leg, set up by the power splitter, critical to duplicate a birdcage transmit field.

During reception, the eight independent resonant loops can be fed back into eight independent receiver channels for SNR optimization 130. Each receiver channel 130 is attached to a low noise figure preamplifier to limit introduction of additional electronics noise. Once the eight signals are acquired, the magnitudes are added together by a sum of squares approach.

In the device of the present invention, the RF coils are arranged based on the following design parameters:
1) geometric overlap to decrease mutual coupling between the loop elements;
2) orthogonal positioning, such that the two signals received from a simultaneous volume can be added together in quadrature to improve SNR;
3) in order to achieve the highest SNR and homogeneity over any given region of interest; and
4) such that the element's arrangement can aid in the reduction of imaging time used in parallel imaging.

Each loop is an independent resonant structure prior to any interactions between multiple loops. These independent loops are ideally manufactured under equal design parameters. The resonant loops used in this design are of equal area and constructed using 1/8 in. copper tape. The copper tape represents inductance and distributed chip capacitors are used to resonate the loop at the Larmor frequency. The value of the loop inductance can be calculated from its length and width. The appropriate formula for calculating the inductance is:

$$L = 0.002l\left(\ln\frac{2l}{w} + \frac{1}{2}\right)$$

where l and w represent the length and width of copper strips in centimeters. The mutual inductance must also be taken into consideration between two parallel strips. The mutual inductance value can be calculated as follows:

$$M = 0.002l\left[\ln\left(\frac{l}{d} + \sqrt{1 + \frac{l^2}{d^2}}\right) - \sqrt{1 + \frac{d^2}{l^2}} + \frac{d}{l}\right]$$

where l again represents the length of the wire and d is the inside dimension between two parallel wires. From the total inductance in the loop and the resonance frequency, the capacitance needed to produce a specified resonance frequency can be calculated by:

$$f = \frac{1}{2\pi\sqrt{2(L_1 + L_2 - M_1 - M_2)C}}$$

$$C = \frac{1}{2(L_1 + L_2 - M_1 - M_2)(2\pi f)^2}$$

where C represents the total capacitance needed to resonate the loop and f is the frequency which must be equal to the Larmor frequency.

Figure 3:
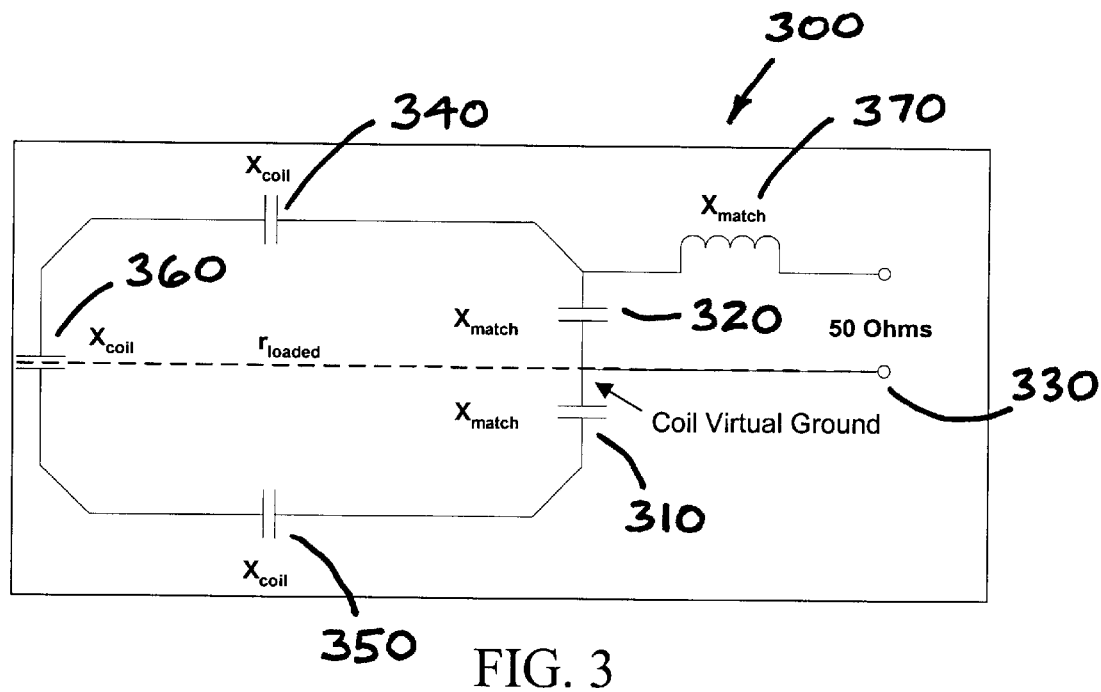
FIG. 3 is a generalized diagram of that portion of the circuitry used for coil tuning and matching.

Once a loop is resonant, it is necessary to measure the natural impedance of the loop with and without a load (phantom or body) present. Since the reactance should be very close to zero at resonance, the real component measured in the loop will represent the losses in the coil. It is desirable for this resistance to be much smaller than the resistance when the coil is loaded. Referring now to FIG. 3, it will be seen that two capacitors 310, 320 based on calculated reactance, are inserted into the circuit 300 and the remaining capacitors 340, 350, 360 are equally distributed about the loop in order to minimize any stray electric fields that cause capacitive coupling between the coil and the load, thus shifting the frequency. By placing two equal capacitor 310, 320 values directly next to each other, a virtual ground point 330 is formed between them. This is only true, however, if the remaining capacitors in the loop are distributed equally around the loop, both electrically and mechanically. An inductor 370 is then placed in series to the matching capacitors 310, 320 to complete the matching circuit 300.

Figure 6:
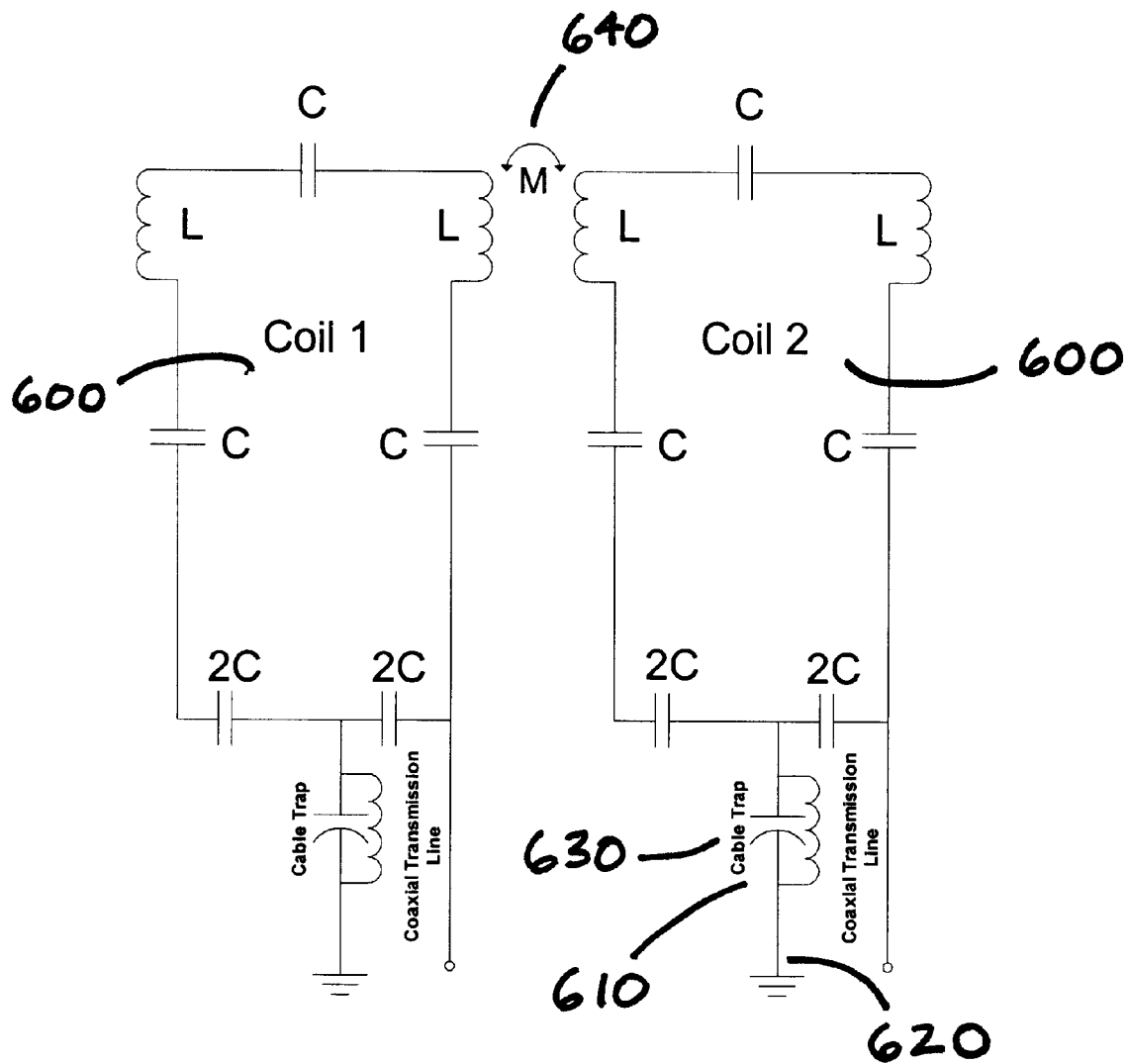
FIG. 6 is a generalized diagram of one pair of coils used in the device of the present invention.

Adjacent loops 600 resonating at equal frequencies have mutual inductance 640. See FIG. 6. A single resonant loop 600 detunes when placed in close proximity to another resonant loop 600. Since the coil geometry ideal for parallel imaging was found to have a coil underlay of 1 cm., adjacent loops 600 had strong mutual coupling. A useful method of decoupling adjacent coil pairs is an overlap technique that uses fields produced by each coil to cancel mutual inductance 640. In the device of the present invention, a negatively wound transformer was added into each coil circuit to cancel mutual inductance between loops. It is designed such that the coupling can be adjusted to zero. But because additional inductance may be introduced into each of the coil loops by this method, it is necessary to also retune and redistribute capacitance about each of the loops (600). Coil tuning in this device may be accomplished using variable capacitors.

It should also be mentioned that a balun is used to eliminate grounding issues when connecting a system to any type of antenna. Types of baluns include the lattice balun, cable traps and a unique situation where you connect the virtual ground on a coil to the system ground. The cable trap is essentially a bandpass filter through the grounding and tuned to the Larmor frequency. The ideal cable trap 610 uses a coaxial transmission line wound into an inductive form. The shield is then resonated using a parallel capacitor 630 to form the high impedance at the frequency of operation. The cable trap 610 is used in the device of the present invention to isolate the coils from the 8-way power splitter 110, the T/R switch 400 and the receiver channels 130. A virtual ground 620 is also used to minimize any additional effects. The cable traps 610 are extremely important when multiple cable s from adjacent coils could introduce coupling into the receivers. Any cable currents or grounding could cause loading effects to the resonant loop and thus detune resonance or introduce additional losses. Once again, it is desirable to limit any losses introduced by the coil and maximize the losses introduced by the patient to maximize SNR. The cable inductance is aligned with the static magnetic field $B_0$ such that RF energy will not couple from the transverse plane into this resonance. Ideally, this cable trap 610 would be shielded from the RF coil itself.

In order to drive the coil equivalently to the 8-leg birdcage RF coil, an 8-way, −9 dB power splitter is required. A high level overview of the power splitter 110 is depicted in FIG. 1. The implementation of the 8-way power splitter 110 can be modularized so that it is easy to troubleshoot and so that each step could be optimized and tuned to the desired outputs. A quadrature, lumped element power splitter was used to interface the system. The output of this splitter is −3 dB, half power and quadrature or 90° out of phase with respect to each other. From this point, six 3-port Wilkinson equal power splitters 110 are used to further split the power into 8 ports. Two 45° phase shifters are used to provide proper phase delays. These are used to drive the coil in the desired format, where each independent coil is out of phase with respect to its nearest neighbor by 45°. Each pair of equal power and phase is connected to coil pairs 180° apart. These loops are driven 180° out of phase compared to each other. This provides the desired phase relationship about the coil.

Figure 4:
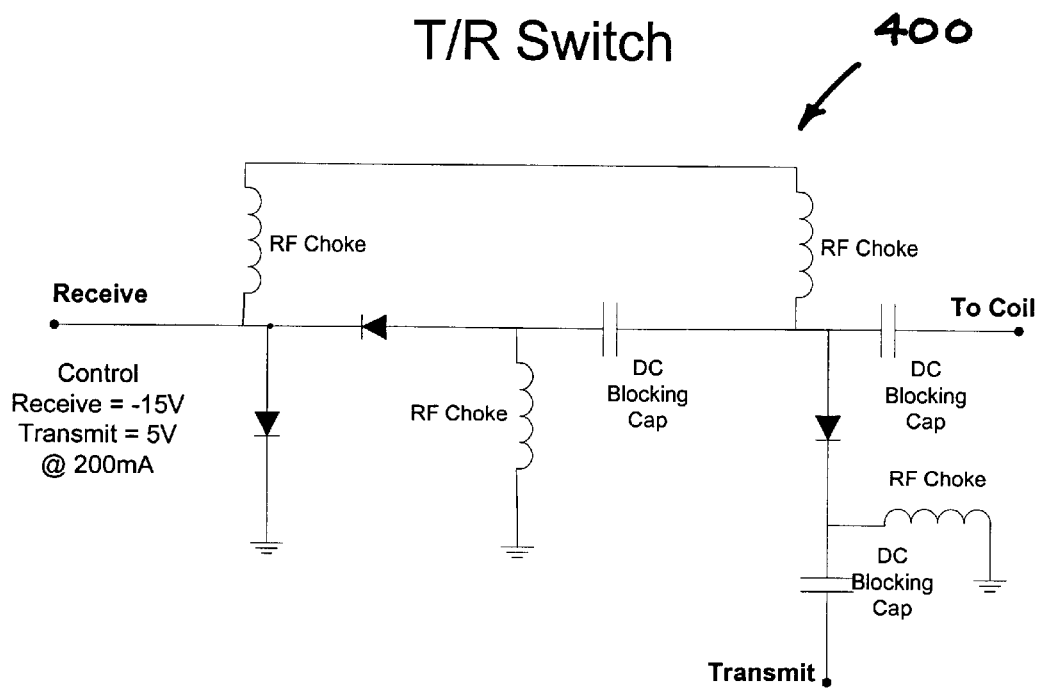
FIG. 4 is a generalized diagrammatic of that portion of the circuitry of the T/R switch used with the coil of the present invention.

A T/R switch 400 is implemented to achieve 8 channel reception by independent coil elements. Each channel has an equal circuit, which activated the switch between transmit, by means of the 8-way power splitter, and the independent receiver channels. See FIG. 4. The phase relationships for each channel during transmit is critical to quadrature operation of the 8 channel coil during the transmit phase.

One embodiment of the coil 200 of the present invention was assembled on a plastic cylinder. See FIG. 5. The diameter of the cylinder is the length of each coil element. Each coil is separated by 1 cm., called underlap. The underlap causes mutual inductance between loops and is eliminated by negatively wound transformers. Cable traps 610 were tuned and connected to the matching locations on each of the independent coils. Corresponding cable lengths were $\lambda/2$ to minimize variation of loading at the splitter connections. This is important to maximize the isolation between each of the independent channels in the 8-way power splitter. It is also important to help minimize loop to loop coupling by use of a low impedance preamplifier 100 to aid in coil decoupling. This is accomplished by using the low impedance of the preamplifier to form a high impedance tank circuit in the quarter wave matching circuit. This is only present during receive and limits current flow around the loops and reduces mutual coupling between them.

The 8-channel system described is unique to the industry for several reasons. The combinations of power and phase form a well-known current distribution based on the birdcage volume coil 200. Since this volume coil has been commonly used for body coils and head coils, its field profiles are well known and liked for large volume signal uniformity. This coil is also unique in that it has 8-channel reception capabilities. This common practice has been shown to provide high-uncorrelated noise between volumes. The difference between this coil and others is its ability to combine the birdcage-like transmit function with the 8-channel phased array reception. This produces higher peripheral SNR images about the volume of the coil, with equal SNR to that achieved by the birdcage, at its center. Benefits provided to the industry by this coil design are single coil operation, combining a well-known tradeoff between volume transmit coils and phased array receiver coils. This tradeoff is bypassed via use of this single coil structure and switching circuitry to achieve ideal operation for both. This coil is quite an improvement over a standard RF body coil, with regards to receive SNR. The standard birdcage RF volume coil has a fixed SNR and coil efficiency. The introduction of a multiple channel receive coil into this form will greatly enhance large patient imaging.

| | |
|---|---|
| 100 | low impedance pre-amplifier |
| 110 | power splitter |
| 130 | receiver channels |
| 140 | phase array coil |
| 200 | birdcage coil |
| 202 | cylindrical form |
| 210 | series elements |
| 220 | parallel elements (shunt elements) |
| 300 | single loop circuit |
| 310 | first series capacitor |
| 320 | second series capacitor |
| 330 | virtual ground |
| 340 | capacitor |
| 350 | capacitor |
| 360 | capacitor |
| 370 | inductor |
| 400 | T/R switch |
| 600 | coil loop |
| 610 | cable trap |
| 620 | virtual ground |
| 630 | capacitor parallel to inductor |
| 640 | mutual inductor |

What is claimed is:

1. A radio frequency (RF) coil for use with an MR imaging system for homogeneous quadrature transmit and multiple channel receive by the RF coil which comprises
   a) a cylinder,
   b) a fixed number of single loop coils equally spaced around the cylinder,
   c) means for driving the coils out of phase with respect to each other azimuthally, and
   d) a switching circuit for changing the transmit coil configuration to phased array reception,
      whereby the need to decouple the transmit coil from the receiver coil is eliminated and the signal to noise ratio benefit is preserved.

2. The RF coil of claim 1 wherein N independent resident loops are placed around an equal diameter cylinder and are equally spaced.

3. The RF coil of claim 2 wherein the phase delay in each loop circumferentially is equal to 360°/N.

4. The RF coil of claim 3 wherein the power splitter switches each independent channel to be received to N receivers as a phased array coil.

5. The RF coil of claim 4 wherein the N independent resident loops are fed back into N independent receiver chains for optimization of signal to noise ratio.

6. The RF coil of claim 5 including means for attaching each receiver chain to a low noise figure preamplifier to limit the introduction of additional electronics noise.

7. The RF coil of claim 6 wherein the resident loops used are of equal area.

8. The RF coil of claim 7 wherein the switching circuit includes a transmit/receive switch to achieve multichannel reception by independent coil elements.

9. The RF coil of claim 8 wherein the number of coil elements used is eight.

10. The RF coil of claim 9 wherein each power splitter output has a 45° delta with respect to each adjacent element.

11. The RF coil of claim 1 wherein the fixed number of single loop coils are equally spaced around a cone or dome shaped structure.

12. For use in an MR imaging system, a radio frequency (RF) coil for homogeneous quadrature transmit and multiple channel receive which comprises
   a) a cylinder,
   b) a fixed number N of single loop coils, said coils being equally spaced around the cylinder,
   c) means for driving the coils out of phase with respect to each other azimuthally, the phase delay in each loop being equal to 360°/N, and
   d) a switching circuit for changing the transmit coil configuration to phased array reception,
      whereby the need to decouple the transmit coil from the receiver coil is eliminated and the signal to noise ratio benefit is preserved.

13. The RF coil of claim 12 wherein a power splitter switches each independent channel to be received to N receivers as a phased array coil.

14. The RF coil of claim 13 wherein the N independent resident loops are fed back into N independent receiver chains for optimization of signal to noise ratio.

15. The RF coil of claim 14 including means for attaching each receiver chain to a low noise figure preamplifier to limit the introduction of additional electronics noise.

16. The RF coil of claim 15 wherein the resident loops used are of equal area.

17. The RF coil of claim 16 wherein the switching circuit includes a transmit/receive switch to achieve multichannel reception by independent coil elements.

18. The RF coil of claim 17 wherein the number of coil elements used is eight.

19. The RF coil of claim 18 wherein each power splitter output has a 45° delta with respect to each adjacent element.

20. The RF coil of claim 12 wherein the fixed number of single loop coils are equally spaced around a cone or dome shaped structure.

21. An MR imaging system having a radio frequency (RF) coil for homogeneous quadrature transmit and multiple channel receive which comprises
   a) a cylinder,
   b) a fixed number of single loop coils, said number of coils being N and further being equally spaced around the cylinder,
   c) means for driving the coils out of phase with respect to each other azimuthally, the phase delay in each loop being equal to 360°/N, and
   d) a switching circuit for changing the transmit coil configuration to phased array reception,
      whereby the need to decouple the transmit coil from the receiver coil is eliminated and the signal to noise ratio benefit is preserved.

22. The imaging system of claim 21 wherein a power splitter switches each independent channel to be received to N receivers as a phased array coil and the N independent resident loops are fed back into N independent receiver chains for optimization of signal to noise ratio.

23. The imaging system of claim 22 including means for attaching each receiver chain to a low noise figure preamplifier to limit the introduction of additional electronics noise.

24. An MR imaging system that includes a radio frequency (RF) coil for homogeneous quadrature transmit and multiple channel receive which comprises
   a) a cylinder,
   b) a fixed number of single loop coils, said number of coils being N and further being equally spaced around the cylinder,
   c) means for driving the coils out of phase with respect to each other azimuthally, the phase delay in each loop being equal to 360°/N, and
   d) a switching circuit for changing the transmit coil configuration to phased array reception, said switching circuit including a transmit/receive switch to achieve multichannel reception by independent coil elements,
      whereby the need to decouple the transmit coil from the receiver coil is eliminated and the signal to noise ratio benefit is preserved.

25. A radio frequency (RF) coil for use with an MR imaging system for homogeneous quadrature transmit and multiple channel receive by the RF coil which comprises
   a) a cylindrical, conical or dome shaped hollow element,
   b) eight single loop coils equally spaced around the hollow element,
   c) means for driving the coils out of phase with respect to each other azimuthally wherein the phase delay in each loop circumferentially equals 45°, and
   d) a power splitter and a switching circuit for changing the transmit coil configuration to phased array reception wherein the power splitter switches each independent channel to be received to eight receivers as a phased array coil,
      whereby the need to decouple the transmit coil from the receiver coil is eliminated and the signal to noise ratio benefit is preserved.

26. The RF coil of claim 25 wherein the eight independent resident loops are fed back into eight independent receiver chains for optimization of signal to noise ratio and further including means for attaching each receiver chain to a low noise figure preamplifier to limit the introduction of additional electronics noise.

* * * * *